(12) United States Patent
Uemura et al.

(10) Patent No.: US 10,403,335 B1
(45) Date of Patent: Sep. 3, 2019

(54) SYSTEMS AND METHODS FOR A CENTRALIZED COMMAND ADDRESS INPUT BUFFER

(71) Applicant: Micron Technology, Inc., Boise, ID (US)

(72) Inventors: Yutaka Uemura, Tokyo (JP); Yasuhiro Takai, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/997,356

(22) Filed: Jun. 4, 2018

(51) Int. Cl.
  *G11C 7/10* (2006.01)
  *G11C 7/22* (2006.01)
(52) U.S. Cl.
  CPC .......... *G11C 7/1072* (2013.01); *G11C 7/1084* (2013.01); *G11C 7/1087* (2013.01); *G11C 7/22* (2013.01)
(58) Field of Classification Search
  CPC ........ G11C 7/1072; G11C 7/1084; G11C 7/22
  USPC .................................................. 365/222, 223
  See application file for complete search history.

(56) References Cited

U.S. PATENT DOCUMENTS

| 6,373,312 B1* | 4/2002 | Barnes ................. H03K 5/1252 327/261 |
| 2003/0025540 A1* | 2/2003 | Nishio ..................... G11C 5/00 327/158 |
| 2007/0079049 A1 | 4/2007 | LaBerge |
| 2008/0024179 A1* | 1/2008 | Hashim ..................... H03L 7/07 327/158 |
| 2009/0031155 A1* | 1/2009 | Hofmann ............... G06F 1/3203 713/321 |
| 2013/0162308 A1 | 6/2013 | Sakashita et al. |
| 2017/0110165 A1 | 4/2017 | Kim et al. |
| 2018/0053567 A1 | 2/2018 | Kim |
| 2018/0059764 A1 | 3/2018 | He |

OTHER PUBLICATIONS

International Search Report and Written Opinion for PCT/US2019/017707 dated May 30, 2019, 13 pages.

* cited by examiner

Primary Examiner — Han Yang
(74) Attorney, Agent, or Firm — Fletcher Yoder, P.C.

(57) ABSTRACT

An apparatus may include a first pad and a first input circuit coupled to the first pad. The first input circuitry may include a first signal propagation path that couples to the first pad, a latch circuit, a second signal propagation path that couples to the latch circuit, and a gate circuitry coupling between the first and second signal propagation paths. The first signal propagation path may have first signal propagation time and the second signal propagation path may have second signal propagation time that is greater than the first propagation time.

18 Claims, 5 Drawing Sheets

SYSTEMS AND METHODS FOR A CENTRALIZED COMMAND ADDRESS INPUT BUFFER

BACKGROUND

The present disclosure relates generally to memory devices and, more particularly, to memory devices implementing synchronous semiconductor memory techniques.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM) device implemented on a dual in-line memory module (DIMM). In this manner, the processor may communicate with the memory device, for example, to retrieve executable instructions, retrieve data to be processed by the processor, and/or store data output from the processor, by means of command and/or address signals (CA signals). These CA signals may be supplied to a common bonding pad, for example, a pin, an external terminal, or the like.

In synchronous semiconductor memory, CA signals are provided to the memory device in synchronism with an external clock signal. In other words, the external clock signal and the CA signals are validated together with a change of a signal, such as a chip select signal, from, for example, a disabled state to an enabled state (e.g., logical low to logical high, or vice versa, based on logical components implemented in the memory device). In the memory device, these CA signals are latched by latching circuitry in response to an enabled latch control signal. A system controller may produce this latch control signal during a set-up time during the change of the chip select signal from the disabled state to the enabled state. Thus, delay circuitry may be provided to delay the arrival of the CA signals to the latch to match an arrival time of the enabled latch control signal from the system controller. However, this delay circuitry may consume an undesired amount of power while the memory device is unselected (e.g., disabled chip select signal), for example, due to power consumed in response to logical state changes of the CA signal transmitted through delay circuitry while the chip select signal is disabled.

BRIEF DESCRIPTION OF THE DRAWINGS

Various aspects of this disclosure may better be understood upon reading the following detailed description and upon reference to the drawings in which.

DETAILED DESCRIPTION

Figure 1:
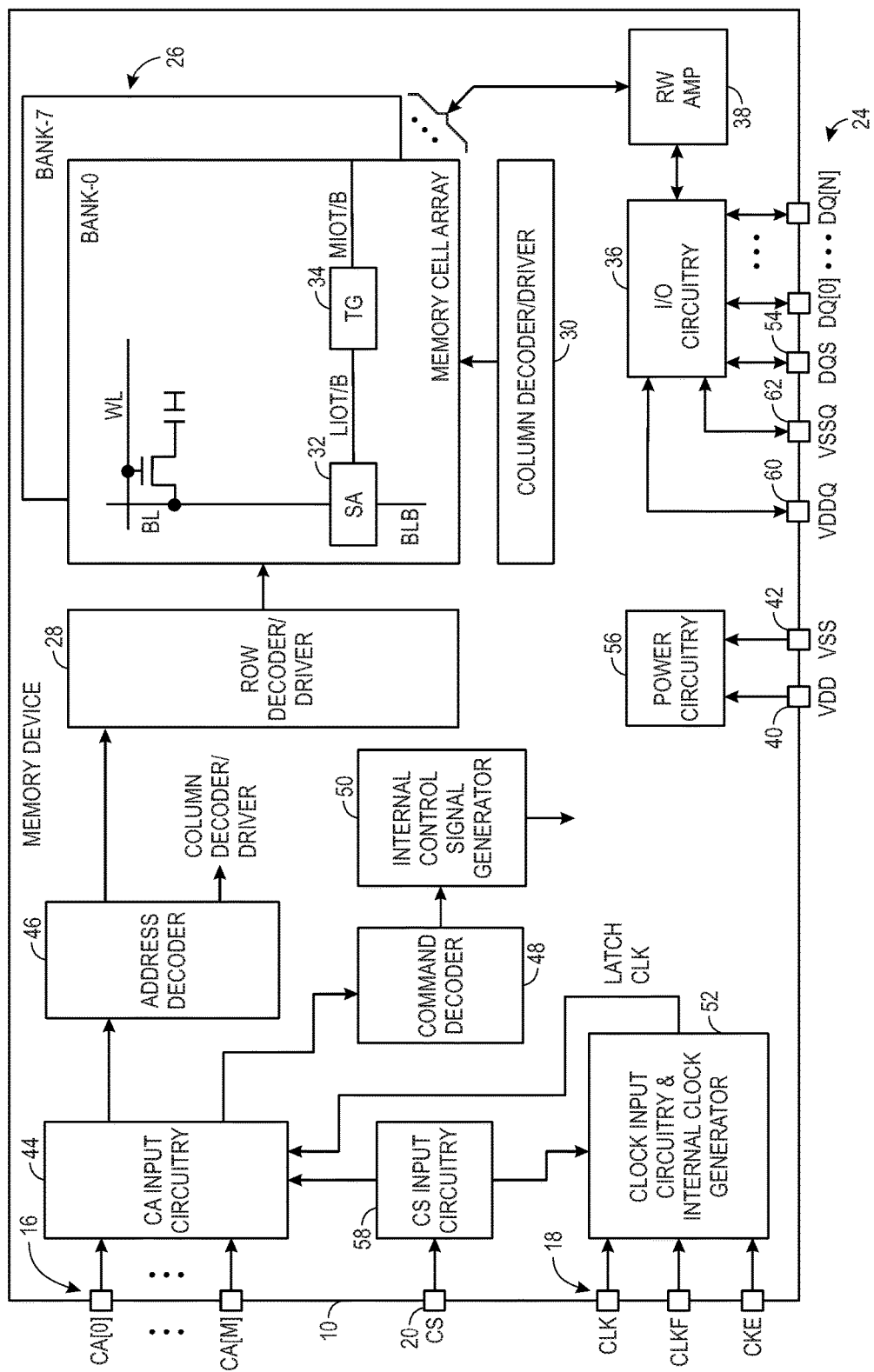
FIG. 1 is a block diagram of a memory device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor via issuing command and/or address (CA) signals to the memory. The CA signals facilitate access operations with respect to memory cell arrays included in a channel of the memory. For purposes of this disclosure, the CA signals should be understood to mean command signal(s), address signal(s), or both, command and address signal(s).

A channel of the memory may receive the CA signals at a common bonding pad, such as a pin, an external terminal, or the like. These CA signals are provided in synchronism with an external clock signal. The external clock signal and the CA signals are validated together in response to the enabling of a chip select (CS) signal, for example, by a memory controller enabling access to that memory device. To do this, logical states of the CA signals are latched by latching circuitry in response to a latch clocking signal that causes the latching to occur. However, this latching occurs in response to the enabling of the chip select signal, thus delay occurs between the enabling of the chip select signal and the timings of the latch clocking signal. To compensate, delay circuitry is provided between the common bonding pad receiving the CA signals and the latching circuitry. However, the delay circuitry may consume undesired amounts of power while the chip select signal is disabled and the memory device is not selected.

To improve memory power consumption, the present disclosure provides techniques for implementing circuitry in the memory device to reduce power consumed while providing the delay used to synchronize ("sync") the received CA signals and the latching circuitry to perform memory operations. Through use of logic circuitry and additional delay circuitry, power consumption of the memory device during a disabled state may be reduced. More specifically, the logic circuitry may stop CA signals being transmitted to all of the delay circuitry enabling only a subset of delay circuitry to consume power while the memory device is disabled, for example, by securing a setup margin. Furthermore, the present disclosure provides techniques for adjusting driving capabilities of the input buffers, thus enabling a memory device to adjust for timing differences through input buffer design, in addition to delay circuitry, providing the additional benefit of design flexibility and improved power consumption.

In some embodiments, these power reducing techniques may be applied to a DIMM device having a DRAM that uses centralized input buffers to receive chip select signals. Implementing centralized input buffers may reduce a physical distance between a chip select signal path and a CA signal path, potentially reducing power used to drive signal values (e.g., logical high and/or logical low voltage levels). Furthermore, this described embodiment may secure a setup margin for CA signal gating by the chip select signal, meaning that a subset of the delay circuitry consumes power while the memory device is disabled. In addition, a clock signal may transmit through an improved transmission path having a direct path architecture, rather than through a clock tree coupling architecture, thereby minimizing a route of the clock path and/or simplifying a complexity of the clock path.

Turning now to the figures, FIG. 1 is a simplified block diagram illustrating certain features of a memory device 10 included in an electronic, or semiconductor, device. In some embodiments, the memory device 10 may be disposed in (physically integrated into or otherwise connected to) a host device or otherwise coupled to a host device. The host device may include any one of a desktop computer, a laptop computer, a pager, a cellular phone, a personal organizer, a portable audio player, a control circuit, a camera, and the like. The host device may also be a network node, such as a router, a server, and/or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. It is noted that the terms used to describe these various examples of systems, like many of the other terms used herein, may share some referents and, as such, should not be construed narrowly in virtue of the other items listed.

The host device may, thus, be a processor-based device, which may include a processor, such as a microprocessor, that controls the processing of system functions and requests in the host device. Further, any host processor may comprise a plurality of processors that share system control. The host processor may be coupled directly or indirectly to additional system elements of the host device, such that the host processor controls the operation of the host device by executing instructions that may be stored within the host device or external to the host device.

In some embodiments, the electronic device may include a DDR5 (Double Data Rate 5) SDRAM (synchronous dynamic random access memory) integrated on a semiconductor chip, a LPDDR4 (Low Power Double Data Rate 4) type DRAM (dynamic random access memory) integrated on a single semiconductor chip, and the like. Each electronic device is provided with a memory device 10 coupled to an external terminal. It should be understood that these external terminals may be bonding pads, inputs, pins, terminals, and the like, but are referred to as pads for ease of discussion herein. The memory device 10 may facilitate read and/or write operations based at least in part on a CA signal and/or external clock signals (Clk and ClkF) supplied from a processing core of the electronic device.

The CA signals and the external clock signals may be supplied to CA pads 16 and clock pads 18 of the electronic device, for example, via a CA bus and a clock bus, or any suitable communicative coupling from a controller or host processor. The CA signals and the external clock signals are supplied to the memory device 10, thereby facilitating access operations with respect to memory cell arrays included in the memory device 10. In addition, the memory device 10 may receive additional signals, such as chip select (CS) signals, from a controller, and these signals may be individually supplied to one or more memory devices 10 of the electronic device. As depicted, the memory device 10 receives a chip select signal at a chip select pad 20. The chip select signal may enable the memory device 10 for memory operations.

Memory device data (DQ) may be read from or written to the memory device 10 at data pads 24 via a communicative coupling. In some embodiments, a memory device 10 may not permit both reading and writing actions, such as in the case of a read only memory (ROM) based electronic device.

A memory device 10 may include one or more memory cell arrays 26 (or memory banks BANK-0 to Bank-7), which each respectively may include word lines (WL) and bit lines (BL, inverse BL as BLB). A row decoder/driver 28 may select word lines, while a column decoder/driver 30 may select bit lines. The bit lines may be paired and coupled to a sense amplifier 32 (SA) of a memory cell array 26. The sense amplifier 32 may amplify a voltage difference generated between the bit lines BL and BLB. The sense amplifier 32 may also supply read data based at least in part on the voltage difference generated between the bit lines BL and BLB to complementary local input/output lines (LIOT/B), where the local input/output line may represent a pair of line (e.g., normal and inverted lines). The read data supplied to the local input/output lines may be transferred to complementary main input/output lines (MIOT/B) via a switch circuit (TG) 34. The read data on the main input/output lines may be converted to single ended signals and transmitted to a data input/output circuit 36 via a read/write amplifier 38 (RW AMP) that acts to translate electrical signal values (e.g., voltage levels) between values interpretable at the pads and values interpretable by the internal memory cell array 26.

As described previously, the memory device 10 may include the CA pads 16, the clock pads 18, the data pads 24, and one or more chip select pads 20. The memory device 10 may also include a voltage pad 40 to receive a first amount of voltage and a voltage pad 42 to receive a second amount of voltage, for example, the first and second amounts of voltage corresponding to logical high and low voltage values (VDD and VSS), respectively. The CA signals are received at the CA pads 16 and may be transmitted to a CA input circuitry (CA INPUT CIRCUITRY) 44. The memory device 10 may include any suitable number of CA pads 16, and as depicted, the memory device 10 includes m-number of CA pads 16.

As previously described, the CA signals may include address signals and command signals. The address signals may transmit to an address decoder 46 and the command signals may transmit to a command decoder 48. The address decoder 46 may supply row addresses to a row decoder/driver 28 and column addresses to a column decoder/driver 30. The command decoder 48 may generate internal commands by decoding the command signals, and may transmit the internal commands to an internal control signal generator 50. For example, the command decoder 48 may generate active signals, read signals, write signals, and the like to transmit to the internal control signal generator 50. In response to the output from the command decoder 48 the internal control signal generator 50 may enable and/or disable a variety of control signals to operate memory device 10 circuitry, for example, mode registers, delay circuitry, reset control circuitry, the column decoder/driver 30, and the row decoder/driver 28, and the like, to perform operations according to the internal commands, such as resetting operations, reading operations, and/or writing operations. For example, in response to an activate command, the command decoder 48 and the internal control signal generator 50 may operate to enable a word line responsive to a row address transmitted to the memory device 10. The CA input circuitry 44, the address decoder 46, the command decoder 48, the column decoder/driver 30, and the row decoder/driver 28 may constitute a CA control circuit and may access the memory cell array 26.

The external clock signals may transmit to the memory device 10 at clock pads 18. The external clock signal Clk and the external clock signal ClkF may be mutually complementary signals (e.g., ClkF is inverse of Clk), and may both be supplied to a clock input circuitry and internal clock generator, herein referred to as clock input circuitry 52. The clock input circuitry 52 may generate one or more internal clock signals, such as a latch clocking signal (Latch Clk) used as a timing signal that defines operation of one or more latching circuits of the memory device 10. The clock input circuitry 52 may also generate various other clocking signals, such as a phase-controller internal clock signal. In some embodiments, the clock input circuitry 52 may include clock distribution circuitry and/or delay locked loop (DLL) circuitry, where data associated with the data input/output circuit 36 is used to determine output timing of the read data (DQ). As depicted, the clock used to time read/written data (DQ) at the data input/output circuit 36 is a data strobe (DQS) signal, which may be accessed at data strobe pad 54. In addition, the data input/output circuit 36 may reference a data high voltage (VDDR) via voltage pad 60 and/or a data low voltage (VSSQ) via voltage pad 62 to facilitate data transfer.

The voltage pad 40 and the voltage pad 42 may receive power-source potentials for a system high voltage (VDD) and for a system low voltage (VSS). The power-source potentials may be supplied to power circuitry 56. The power circuitry 56 generates various internal potentials based at least in part on the power-source potentials. The internal potentials may transmit to the row decoder 28, the sense amplifiers 32, and the like to facilitate operation of the memory device 10. Furthermore, the voltage pad 40 and the voltage pad 42 may operatively couple to a power-on detector to determine if electrical signals (e.g., current) are flowing at the voltage pad 40 and/or the voltage pad 42. In response to this determination, a memory device 10 may change operation, for example, may act to reset its own circuitry to prepare for a next memory operation.

In addition, the chip select pad 20 may receive a chip select signal to activate the memory device 10 for memory operations. The chip select signal transmits from the chip select pad 20 to a chip select input circuitry 58 (CS INPUT CIRCUITRY). The chip select input circuitry 58 includes a variety of circuitry to enable the CA input circuitry 44 to permit transmission of CA signals into the memory device 10.

The CA input circuitry 44 may also include delay circuitry and latching circuitry, for example, to enable the external clock signal and the CA signals to validate together on the same rising and/or falling edge. In response to the enabling of a chip select signal, the chip select signal may act to activate combinational logic circuitry such that the CA signals are permitted to transmit from a first delay circuit to a second delay circuit. By utilizing the chip select signal to mediate transmission of the CA signals from the CA input circuitry 44, the memory device 10 consumes less power while continuing to provide the same delay to cause proper latching of the CA signals. Thus, the memory device 10 power consumption improves while the CA signals are delayed to cause timing of the CA signal data to align with the latch clocking signal (e.g., the latch pulse to operate the latch), enabling the latching circuitry to store the actual data of the CA signal.

Figure 2:
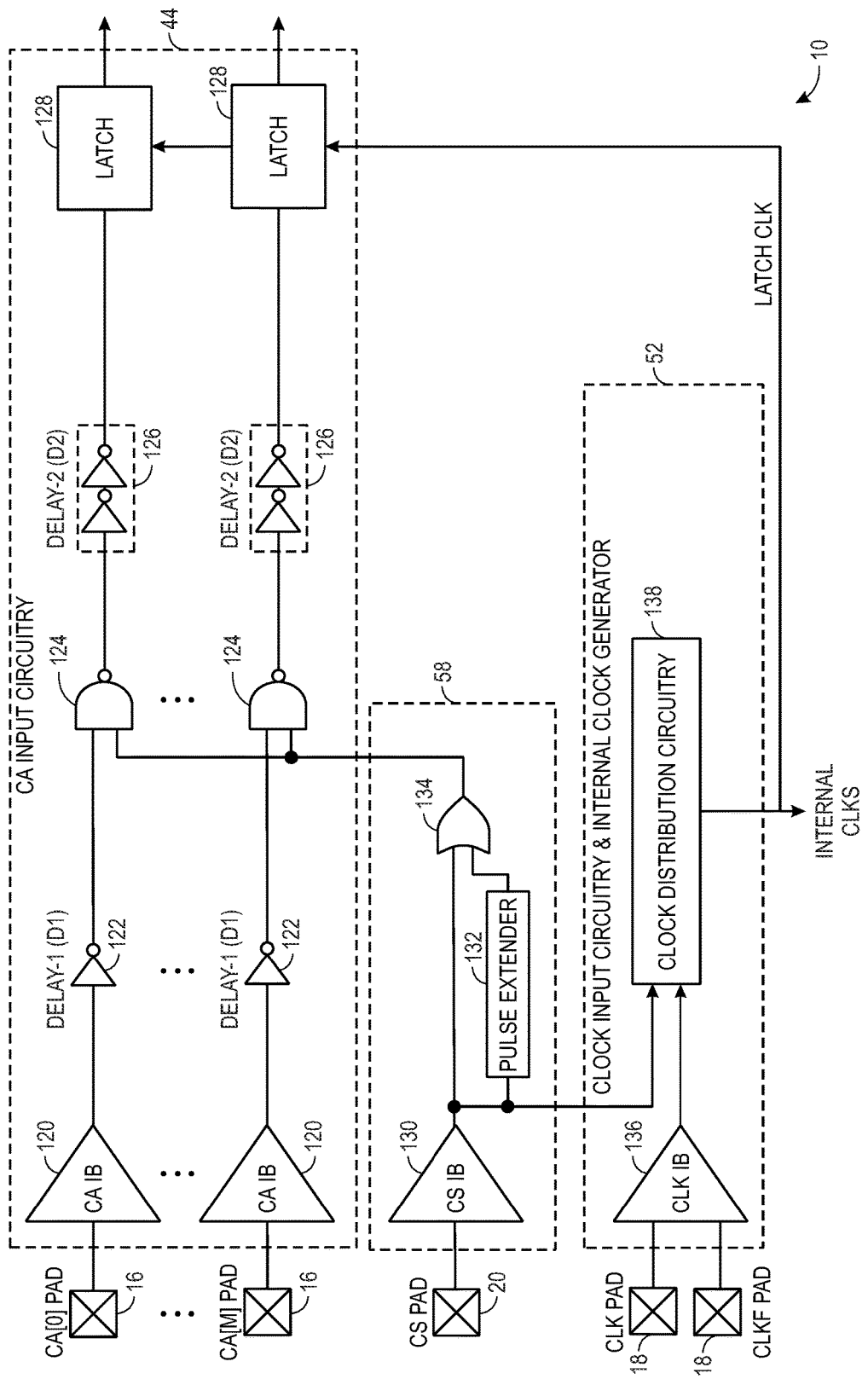
FIG. 2 is a block diagram of input circuitry and clock generation circuitry of the memory device of FIG. 1, in accordance with an embodiment.

To help illustrate, FIG. 2 depicts an example of CA input circuitry 44, chip select input circuitry 58, and clock input circuitry 52. As discussed above, a delay time between each CA signal received and the activating edge of the latch clocking signal (e.g., a rising edge) may correspond to any suitable time duration, in particular, a set-up time. For a particular embodiment, the set-up time is the duration of time between the change of the chip select signal from disabled to enabled and the activating edge of the latch clocking signal—that is, the edge of the latch clocking signal that permits latching circuitry to latch a data value (e.g., a rising edge or a falling edge). It should be appreciated that the depicted circuitry is merely intended to be illustrative and not limiting. For example, any number of delay-causing elements may be used in the CA input circuitry 44 to cause a variety of delay lengths to input CA signals to match a variety of set-up times or time durations.

As depicted, the CA input circuitry 44 may include one or more CA input buffers 120 (CA IB), one or more delay blocks 122 (Delay-1 (D1)) (e.g., delay-causing element), one or more logic gates 124, one or more delay blocks 126 (Delay-2 (D2)), and one or more latches 128, where the one or more latches 128 may be included in output circuitry of the memory device 10 and/or of the CA input circuitry 44 to manage transmission of the CA input signal to the rest of the memory device 10. Each of the CA pads 16 are operably coupled to a respective CA input buffer 120. Upon receiving one or more CA signals at CA pad 16, the CA signals transmit to respective CA input buffers 120. From the CA input buffer 120, the CA signals transmit to delay block 122. It is noted that the delay circuitry between each CA input buffer 120 and latches 128 is divided into two portions included in two separate signal propagation paths separated by the logic gate 124, where the first signal propagation path has a first delay value and the second signal propagation path has a second delay value based on the total timing delay caused by the components of the separate paths. As illustrated, the delay block 122 is an inverting logic gate that causes a first time delay smaller than a second time delay caused by the delay block 126. For the purposes of this disclosure, the delay block 122 is shown as having one inverting logic gate and the delay block 126 is shown as having two inverting logic gates. It should be understood, however, that any number of inverting logic gates and/or delay-causing circuitry may be used to delay the CA signals to cause any variety of delays including the case where the delay block 122 causes a delay shorter than the delay caused by the delay block 126.

The logic gate 124 is shown as a NAND gate with a first input receiving the output from the delay block 122 and a second input receiving a control signal from the chip select input circuitry 58. When the control signal is disabled, the NAND gate is closed to stop the delay block 122 output from being transmitted to the delay block 126. When the control signal is enabled, the NAND gate is open and permits the delay block 122 output to be transmitted to the delay block 126 input. Accordingly, the delay block 122 responds to changes in voltage levels of the CA signal (e.g., data values, logic levels), and thus the delay block 122 consumes power while the control signal is disabled. More importantly, because the output from the delay block 122 is stopped from being transmitted to the delay block 126, the delay block 126 does not consume a substantial, or significant, amount of power while the control signal is disabled (e.g., while the memory device 10 is not selected and inactive).

In some embodiments, the logic gate 124 is to be opened prior to the logic gate 124 receiving the CA signal. In these embodiments, a chip select input buffer 130 (CS IB) that receives the chip select signal is selected to have a stronger and/or larger driving capability than the CA input buffer 120. Thus, the logic gate 124 receives the enabled control signal before the CA signal. It is noted that in some instances, the CA input buffer 120 provides a delay to the CA signal such that delay block 122 may be designed to provide no delay because the CA input buffer 120 provides sufficient delay.

In addition the chip select input circuitry 58 may include a pulse extender 132 and a logic gate 134 to create the control signal from the chip select signal. The pulse extender 132 may be any suitable circuitry to permit a state of the chip select signal to be extended. The pulse extender 132 may extend the duration of an enabled chip select signal to cause the latches 128 to be enabled for enough time to store data of the CA signals in response to the latch clocking signal (LATCH CLK). In this embodiment, the logic gate 134 is shown as an OR gate. Furthermore, as depicted, the clock input circuitry 52 may include a clock input buffer 136 and clock distribution circuitry 138. These circuits are used to generate various internal clock signals, including the latch clocking signal, based at least in part on the clock signal received at clock pads 18. The internal clock signals are used in data read and write operations, as discussed earlier.

Figure 3:
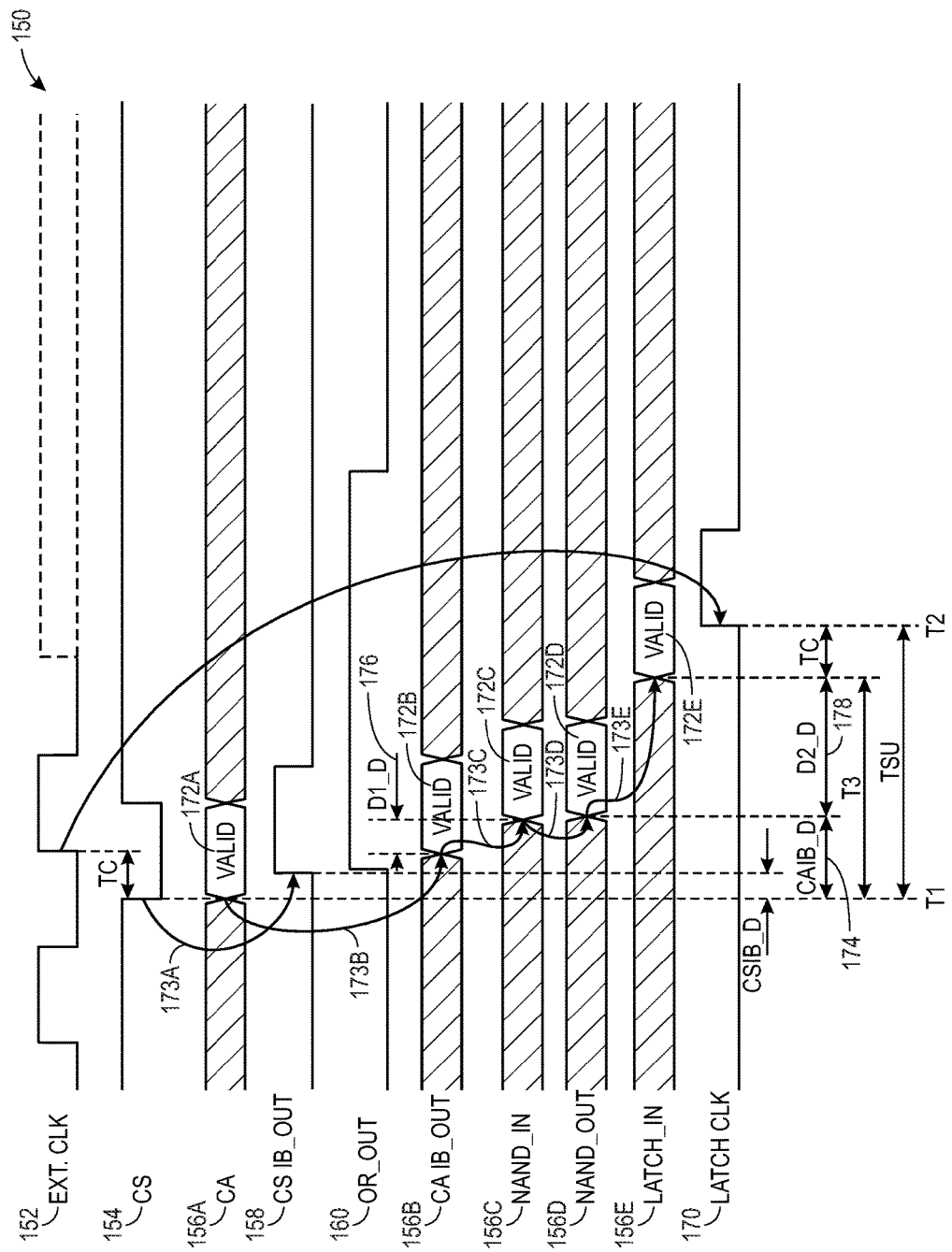
FIG. 3 is a timing diagram of signals used in operation of the input circuitry and clock generation circuitry of FIG. 2, in accordance with an embodiment.

To elaborate further on the operation of CA input circuitry 44, chip select input circuitry 58, and clock input circuitry 52, FIG. 3 depicts a timing diagram 150 including various memory device 10 signals and arrows indicating a progression of overall delay experienced by the various memory device 10 signals. It should be understood that FIG. 3 is merely intended to be illustrative and not limiting—for example more or less signals may be used to operate the CA input circuitry 44, the chip select input circuitry 58, and/or the clock input circuitry 52.

As illustrated, the timing diagram 150 includes an external clock signal 152 (EXT. CLK), a chip select signal 154 (CS), a CA signal 156A (CA), a chip select input buffer output signal 158 (CS IB_OUT), an OR gate output signal 160 (OR_OUT), a CA input buffer output signal 156B (CA IN_OUT), a NAND gate input signal 156C (NAND_IN), a NAND gate output signal 156D (NAND_OUT), a latch input signal 156E (LATCH_IN), and a latch clocking signal 170 (LATCH CLK). The external clock signal 152, the chip select signal 154, and the CA signal 156A may be provided to the memory device 10 from an external device, for example, an external memory controller, to the clock pads 18, the CA pads 16, and the chip select pad 20.

To elaborate, the external clock signal 152 may be a periodic signal received by the memory device 10. The chip select signal 154 and the CA signal 156A are provided to the memory device 10 before a next rising edge of the external clock signal 152, where the next rising edge is set to occur a time duration (TC) after the enabled chip select signal 154. The duration of time between the enabling of the chip select signal 154 (T1) and the enabling of the LATCH CLK signal 170 (T2) corresponds to a set-up time (TSU), and thus, the CA signal 156A data 172A (VALID) arrival to the latch 128 is delayed (e.g., data 172E) an appropriate amount of time (T3) for correct latching. As depicted, the data 172A, through the various circuits of the CA input circuitry 44, is delayed to become the data 172E. It should be appreciated that the CA signal 156A data 172A, the CA IN_OUT signal 156B data 172B, the NAND_IN signal 156C data 172C, the NAND_OUT signal 156D data 172D, and the LATCH_IN signal 156E data 172E are the same received CA signal 156A (having the data 172A) but with each iteration of delay added, the CA signal 156A becomes the LATCH_IN signal 156E. The timing delay progression of the CA signal 156A is shown by arrows 173.

Referring to FIG. 3 in tandem with FIG. 2, the CA input circuitry 44 may receive the CA signal 156A at CA pad 16. From the CA pad 16, the CA signal 156A transmits to the CA input buffer 120, and transmits from the CA input buffer 120 as the CA IN_OUT signal 156B, where the beginning of the data 172B is delayed a time duration 174 (CAM D), as indicated by arrow 173B. The CA IN_OUT signal 156B transmits through the delay block 122 and to the logic gate 124. After transmitting through the delay block 122, the CA IN_OUT signal 156B becomes the NAND_IN signal 156C, where the beginning of the data 172C is delayed a time duration 176 (D1_D) from the previous beginning of the data 172B, indicated by arrow 173C. Upon transmission through the logic gate 124 (e.g., permitted by the chip select signal 154 and the CS IB_OUT signal 158 activating, or opening, the logic gate 124 before reception of the NAND_IN signal 156C), the NAND_IN signal 156C becomes the NAND_OUT signal 156D and may be delayed a negligible amount by the logic gate 124, indicated by arrow 173D. The NAND_OUT signal 156D may be transmitted through delay block 126 thus experiencing a third delay. Upon the NAND_OUT signal 156D reaching the latch 128 input, the signal is delayed by a time duration 178 and becomes the LATCH_IN signal 156E with data 172E (e.g., delayed data 172A), indicated by arrow 173E. Thus, the data 172E is delayed to the point where the LATCH CLK signal 170 captures its true value by activating the latch 128 at T2 occurring at the middle of the data 172E transmission.

In addition, the chip select input circuitry 58 receives the chip select signal 154 at the chip select pad 20, and the chip selected signal 154 is transmitted to the chip select input buffer 130. Upon transmission from the chip select input buffer 130, the chip select signal 154 transmits to the logic gate 134 (e.g. an OR gate), the pulse extender 132, and the clock distribution circuitry 138 to activate the memory device 10 for use in memory operations. The pulse extender 132, in combination with the logic gate 134, operates to create an enabled signal for a duration of time longer than the enabled signal of the chip select signal 154, where this enabled signal may be the OR_OUT signal 160. The duration of time that the chip select signal 154 is extended may equal a total time used to latch the CA signal 156 data 172 in the latches 128 (e.g., equal to the delay caused by the delay block 122, the delay block 126, the CA input buffer 120, the logic gate 124, and transmission between components). The chip select signal 154 may be extended to keep components of the memory device 10 in operation. For example, the clock distribution circuitry 138 may be enabled during the memory device 10 operation to create internal clock signals used to perform operations of the memory device 10.

Figure 4:
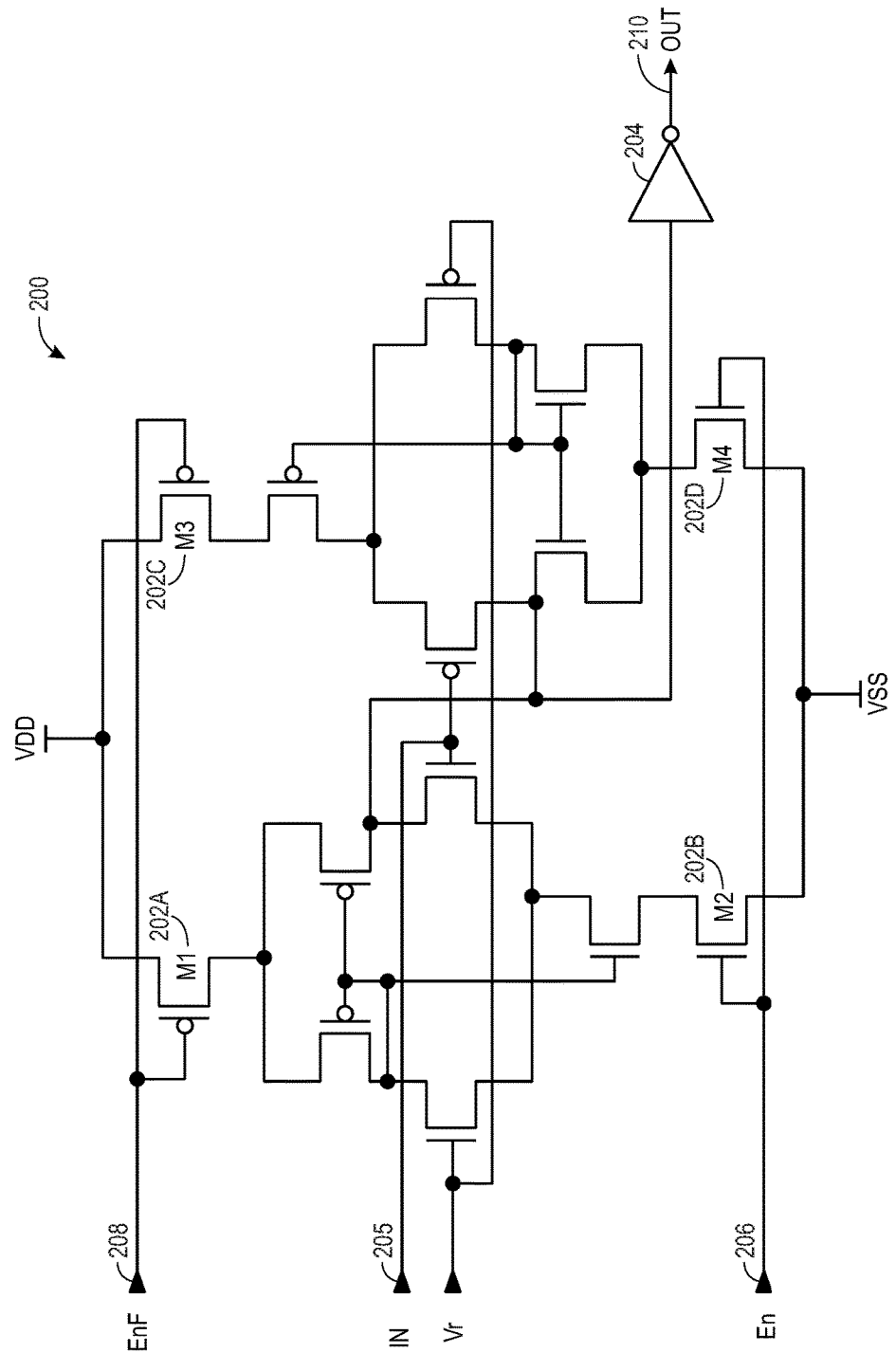
FIG. 4 is a circuit diagram of an input buffer of the input circuitry of FIG. 2, in accordance with an embodiment.

To better explain how a chip select input buffer 130 may have a stronger driving ability than a CA input buffer 120, FIG. 4 depicts an example embodiment of an input buffer 200 having an inverting logic gate 204 and one or more transistors 202. It should be appreciated that the input buffer 200 is merely intended to be illustrative and not limiting. For example, an input buffer may include a variety of circuitry and/or switching elements capable of activating in response to one or more control signals.

As depicted, the input buffer 200 is a parallel p-type (p-channel) and n-type (n-channel) metal-oxide-semiconductor field-effect transistor (MOSFET) differential amplifier of an inverting type. It is to be noted that a transistor with a circle at a gate represents a p-type (p-channel) MOSFET and a transistor without a circle at a gate represents an n-type (n-channel) MOSFET. A chip select input buffer 130 may have a similar structure to a CA input buffer 120, where both may follow layouts and configurations depicted with the input buffer 200. However, the chip select input buffer 130 may use transistors 202 (M1 202A, M2 202B, M3 202C, M4 202D) larger in size than those same transistors 202 used in the CA input buffer 120. By making the transistors 202 larger in the chip select input buffer 130, the chip select input buffer 130 may have an increased driving ability compared to the CA input buffer 120.

Elaborating on operation of the input buffer 200, an input signal (IN), for example, the chip select signal 154 and/or the CA signal 156A, is received at a pad 205. After transmission through the input buffer 200, the input signal is amplified and delayed for a particular amount of time to comply with circuitry propagation delays. Enable signals (EN, ENF) received at control lines 206 and 208 may activate transistors 202, causing buffering of the input signal to occur. The input buffer 200 may amplify the input signal based at least in part on the voltage difference between the input signal (IN) and a reference voltage (Vr). Prior to outputting at output node 210, the amplified and/or delayed input signal may be transmitted through the inverting logic gate 204. Thus, an amplified, delayed, and/or inverted input signal may be transmitted from the input buffer 200 from output node 210. In operation, this output signal may be transmitted to the delay blocks 122 from CA input buffer 120, or to the logic gate 134 and/or the pulse extender 132 from the chip select input buffer 130.

Figure 5:
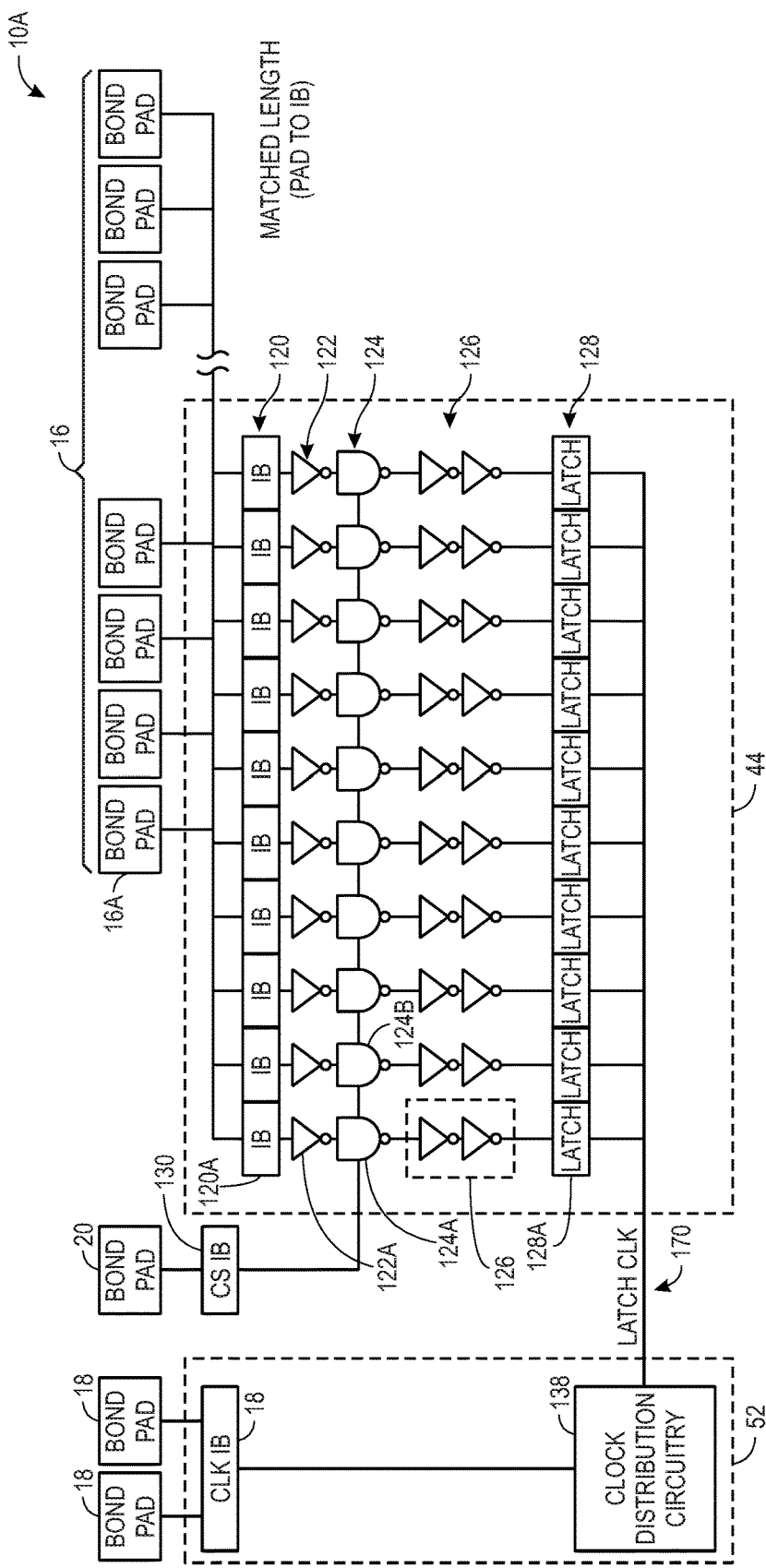
FIG. 5 is a block diagram of input circuitry and clock generation circuitry of the memory device of FIG. 1, in accordance with an additional embodiment.

These described techniques may be implemented in a variety of memory devices. FIG. 5 depicts an additional embodiment of the memory device 10, such as a DRAM device, a memory device 10A including the CA input circuitry 44, the chip select input buffer 130, and the clock input circuitry 52. It should be appreciated that the depicted circuitry is merely intended to be illustrative and not limiting. For example, any number of delay-causing elements may be used in the CA input circuitry 44 to cause a variety of delay lengths to input CA signals to match a variety of set-up times or time durations.

As highlighted in the depicted embodiment of the memory device 10A, the CA input buffers 120 may be disposed in a centralized location, or a centrally-situated location, on the memory device 10A, as opposed to disposed in a distributed layout as shown in FIG. 2, wherein the CA input buffers 120 are located near the CA pads 16. Using a centralized location for the CA input buffers 120 may minimize, or relatively decrease, a physical distance between the chip select input buffer 130 and the CA input buffers 120. This minimized physical distance may reduce power used by the memory device 10A, for example, because generally weaker signals may be used to transmit the same data than the signals carrying data over longer distances. Furthermore, using a higher powered input buffer 200 (e.g., an input buffer 200 with larger transistors) for the chip select input buffer 130 may facilitate in boosting relative speeds of the chip select input buffer 130 when compared to the CA input buffers 120. Increasing the relative speed of the chip select input buffer 130 may help to expand a setup margin for command and/or address gating.

Viewing FIG. 5 in conjunction with signals described with reference to FIG. 3, to operate the depicted portion of the memory device 10A, one or more CA signals 156A are respectively received at CA pads 16. As a reminder, these CA signals 156A are latched by the latches 128 in response to an enabled LATCH CLK signal 170. A system controller, such as clock input circuitry 52, may generate this latch control signal during a set-up time following the change of the chip select signal (e.g., chip select signal 154) from a disabled state to an enabled state. Thus, delay circuitry, such as delay blocks 122 and delay blocks 126, may be used to delay the arrival of the CA signals 156A to the latches 128 to match an arrival time of the enabled latch control signal from the system controller. From the CA pads 16, the CA signals 156A transmit to CA input buffers 120. Because each CA pad 16 respectively couples to a CA input buffer 120, a number of the CA pads 16 equals a number of centralized CA input buffer 120, such that a CA pad 16A couples to a CA input buffer 120A while not coupling to a CA input buffer 120B. The CA input buffer 120 may amplify and/or delay the CA signals 156A and may transmit the CA IN_OUT signal 156B, as a modified CA signal 156A, to a respective of the delay blocks 122, such that the CA IN_OUT signal 156B from CA input buffer 120A transmits to delay block 122A. The CA IN_OUT signal 156B may be transmitted through the respective delay blocks 122 to delay the data 172B.

The NAND_IN signal 156C transmitted from the delay blocks 122 may be received by logic gates 124. As depicted, the logic gates 124 are NAND gates that activate in response to inputs from the delay blocks 122 and from the chip select input buffer 130. To describe the illustrated NAND gate operation, if both the input from the delay block 122 and the input from the chip select input buffer 130 equal one (e.g., Boolean 1, logical high voltage), the NAND gate outputs a zero. However, if either the input from the delay block 122 and/or the input from the chip select input buffer equal zero (e.g., Boolean 0, logical low voltage), the NAND gate outputs a one. It is noted that any suitable logic gate may be used as the logic gate 124, and that the NAND gate is described for ease of discussion.

Since the logical gates 124 operate independently, a logical gate 124A may output a different value from a logical gate 124B based at least in part on the input received from the delay blocks 122. In addition, since the data transmitted by the NAND_IN signal 156C is essentially stopped at the logical gate 124 until transmission is permitted by the chip select signal 154, only components coupled between the CA pads 16 and the logical gates 124 consume electrical power while the chip select signal 154 is disabled and not permitting the NAND_IN signal 156C from transmitting to the delay blocks 126.

Upon the chip select signal 154, via the OR_OUT signal 160, permitting the NAND_IN signal 156C to transmit from the logical gates 124, the NAND_OUT signal 156D transmits through the delay blocks 126 and may be delayed a second amount of time. The total value of the time delay (T3) applied to the CA signal 156A to create the LATCH_IN signal 156E approximately equals the set-up time duration (TSU) minus the time duration (TC) after the enabled chip select signal 154 described in discussions associated with FIG. 3. Thus, upon transmission from the delay blocks 126 to the centralized latches 128, the latch input signal data 172E may be correctly latched by the latches 128 on the rising edge of the LATCH CLK signal 170 transmitted via the depicted communicative coupling (LATCH CLK PATH).

The depicted clock distribution circuitry 138 may generate internal clock signals, including the LATCH CLK signal 170 transmitted to control latching operations of the latches 128, based at least in part on the external clock signal 152 received by the memory device 10A at the clock pads 18. It is noted that one benefit of using centralized latches 128 and centralized CA input buffers 120 is that a clock tree (e.g., clock tree architecture) to disburse the LATCH CLK signal 170 may be optionally implemented. Implementation of the clock tree may be optionally used because delays caused by the path length between the clock distribution circuitry 138 and the latches 128 is negligible in this arrangement of components following a direct path architecture.

Accordingly, the technical effects of the present disclosure include techniques for improving power consumption of inactive (e.g., unselected) portions of a memory device and/or power consumption of an inactive memory device. The techniques include systems and methods for including, in a command and/or address input circuit, one or more delay blocks before and after a logic gate. The logic gate may be controlled by a chip select signal to arbitrate transmission of command and/or address signal inputs. Because the logic gate arbitrates transmission of the command and/or address signal inputs, only components coupled in-between a command and/or address pad and the logic gate consume power while the memory device is inactive, thus stopping power consumption by additional delay blocks of the command/address input circuit. Furthermore, implementing the arbitrating logic gate may enable input buffers and latches of the command/address input circuit to be disposed in a centralized location on the memory device, enabling direct communication of the latch clocking signal to the centralized latches as opposed to using a clock tree to transmit the latch clocking signal.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus comprising:
   a first pad;
   a first input circuit coupled to the first pad, wherein the first input circuit comprises:
   a first signal propagation path coupled to the first pad;
   a latch circuit;
   a second signal propagation path coupled to the latch circuit; and
   a gate circuit between the first and second signal propagation paths, wherein the first signal propagation path is configured to have first signal propagation time and the second signal propagation path is configured to have second signal propagation time that is greater than the first signal propagation time, and wherein the gate circuit is configured to cause a signal to be transferred from the first signal propagation path to the second signal propagation path in response to a first level of a control signal and to prevent the signal from being transferred from the first signal propagation path to the second signal propagation path in response to a second level of the control signal;
   a second pad; and
   a second input circuit coupled to the second pad configured to provide the control signal.

2. The apparatus of claim 1, wherein the first signal propagation path comprises a first delay circuit having a first delay time, and wherein the second signal propagation path comprises a second delay circuit having second delay time that is greater than the first delay time.

3. The apparatus of claim 2, wherein the first pad is configured to receive at least one of command and address signals, and wherein the second pad is configured to receive a chip select signal.

4. The apparatus of claim 2, wherein the first delay circuit comprises a first number of delay elements and the second delay circuit comprises a second number of delay elements that is smaller than the first number of delay elements.

5. The apparatus of claim 1, wherein the first signal propagation path comprises a first input buffer having a first driving capability, and wherein the second input circuit comprises a second input buffer having second driving capability that is greater than the first driving capability.

6. The apparatus of claim 5, wherein the first pad is configured to receive at least one of command and address signals, and wherein the second pad is configured to receive a chip select signal that becomes valid substantially simultaneously with the at least one of command and address signals becoming valid.

7. A memory device comprising:
   a first pad; and
   a first input circuit coupled to the first pad, wherein the first input circuit comprises:
   a first delay block coupled to the first pad;
   a second delay block coupled to output circuitry of the first input circuit; and a gate circuit coupled between the first and second delay blocks, wherein the first delay block is configured to contribute to a first signal propagation time and the second delay block is configured to contribute to a second signal propagation time, and wherein the gate circuit is configured to cause a signal to transmit from the first delay block to the second delay block in response to a first level of a control signal while preventing the signal from being transmitting from the first delay block to the second delay block in response to a second level of the control signal;

a second pad; and a second input circuit coupled to the second pad and configured to provide the control signal.

8. The memory device of claim 7, wherein the first signal propagation time and the second signal propagation time are different from each other.

9. The memory device of claim 8, wherein the second signal propagation time is greater than the first signal propagation time.

10. The memory device of claim 7, wherein the output circuitry comprises a latch configured to store at least one command and address signals in response to a latch control signal.

11. The memory device of claim 10, wherein the latch is disposed adjacent to one or more additional latches in a centralized location on the memory device.

12. The memory device of claim 7, wherein the first delay block comprises inverting circuitry configured to cause a first delay time, wherein the second delay block comprises inverting circuitry configured to cause a second delay time that is greater than the first delay time, and wherein the first signal propagation time is based at least in part on the first delay time and wherein in the second signal propagation time is based at least in part on the second delay time.

13. The memory device of claim 7, wherein the first pad is configured to receive at least one of command and address signals, and wherein the second pad is configured to receive a chip select signal that becomes valid substantially simultaneously with the at least one of command and address signals becoming valid.

14. The memory device of claim 7, comprising:

a first input buffer coupled to the first pad, wherein the first input buffer is configured to have a first driving capability; and a second input buffer coupled to the second pad, wherein the second input buffer is configured to have a second driving capability that is greater than the first driving capability.

15. A memory device, comprising:

one or more pads coupled to one or more input circuits, wherein each of the input circuits comprises:

a first group of inverting logic gates coupled to a respective pad of the one or more pads;

a latch circuit;

a second group of inverting logic gates coupled to the latch circuit; and a gate circuit between the first and second group of inverting logic gates, wherein the first group of inverting logic gates are configured to cause a first signal delay and the second group of inverting logic gates are configured to cause a second signal delay, wherein the gate circuit is coupled to a second pad of the one or more pads, wherein the second pad is configured to receive a chip select input signal, and wherein the second pad is configured to transmit the chip select input signal to each of the one or more input circuits to operate the gate circuit to permit transmission of a signal from a first signal propagation path to a second signal propagation path.

16. The memory device of claim 15, wherein the first group of inverting logic gates are configured to cause less delay than the second group of inverting logic gates.

17. The memory device of claim 15, wherein each of the input circuits are configured to cause a substantially similar delay.

18. The memory device of claim 15, wherein each of the one or more input circuits comprises an input buffer, and wherein the input buffer and the latch circuit are physically disposed in a centralized location.

* * * * *